(12) United States Patent
Singer et al.

(10) Patent No.: US 11,527,689 B2
(45) Date of Patent: Dec. 13, 2022

(54) OPTOELECTRONIC ASSEMBLY, METHOD AND MOLDED PART

(71) Applicant: OSRAM OLED GmbH, Regensburg (DE)

(72) Inventors: Frank Singer, Regenstauf (DE); Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/975,088

(22) PCT Filed: Feb. 22, 2019

(86) PCT No.: PCT/EP2019/054448
§ 371 (c)(1),
(2) Date: Aug. 21, 2020

(87) PCT Pub. No.: WO2019/162443
PCT Pub. Date: Aug. 29, 2019

(65) Prior Publication Data
US 2021/0091283 A1      Mar. 25, 2021

(30) Foreign Application Priority Data
Feb. 23, 2018   (DE) .................... 10 2018 104 169.1

(51) Int. Cl.
*H01L 33/62*   (2010.01)
*G02B 6/42*    (2006.01)

(52) U.S. Cl.
CPC ............ *H01L 33/62* (2013.01); *G02B 6/4246* (2013.01); *G02B 6/4292* (2013.01)

(58) Field of Classification Search
CPC ..... H01L 33/62; H01L 25/0753; H01L 33/52; G02B 6/4246; G02B 6/4292; F21V 33/0008; F21Y 2115/10; H05K 2201/09263; H05K 2201/10106; H05K 2201/10946; H05K 1/038; H05K 1/189
See application file for complete search history.

(56) References Cited

U.S. PATENT DOCUMENTS

| | | | |
|---|---|---|---|
| 8,338,841 B2 | 12/2012 | Henry et al. | |
| 9,391,286 B1 | 7/2016 | Cho et al. | |
| 9,706,647 B2 * | 7/2017 | Hsu ................ | H05K 1/0283 |
| 2003/0211797 A1 | 11/2003 | Hill et al. | |
| 2008/0032461 A1 | 2/2008 | Popovich | |

(Continued)

FOREIGN PATENT DOCUMENTS

| | | |
|---|---|---|
| DE | 102015109333 A1 | 12/2016 |
| WO | 2012008233 A1 | 1/2012 |

*Primary Examiner* — Ellen E Kim
(74) *Attorney, Agent, or Firm* — ArentFox Schiff LLP

(57) ABSTRACT

An optoelectronic assembly comprises at least two electrical contacts on a surface of an optoelectronic component for supplying electrical energy for generating electromagnetic radiation, and at least two meander-shaped contact lugs, each of which comprises a first and a second section. The first section in each case of the at least two meander-shaped contact lugs is coupled to one of the at least two electrical contacts. The second section in each case of the at least two meander-shaped contact lugs comprises a fastening element which is designed to go into a mechanical linkage to a fiber structure of a carrier and to create an electrical connection to the first section.

20 Claims, 6 Drawing Sheets

(56) References Cited

U.S. PATENT DOCUMENTS

Figure 1:
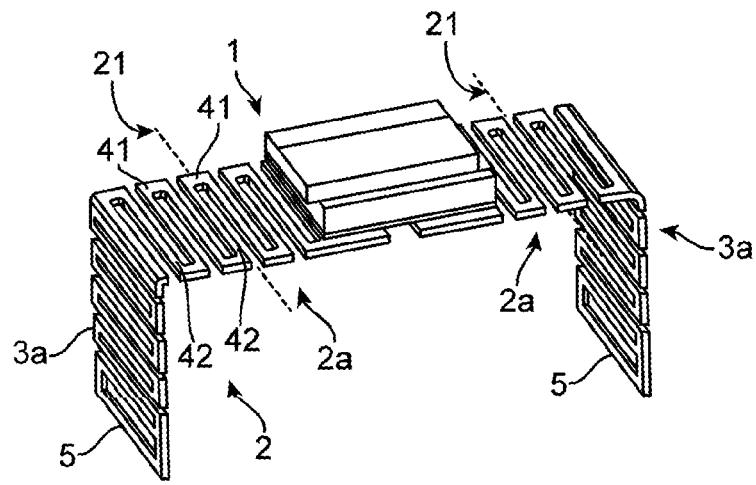

| | | |
|---|---|---|
| 2008/0198578 A1 | 8/2008 | Finn |
| 2010/0238637 A1 | 9/2010 | Bhattacharya et al. |
| 2012/0025227 A1* | 2/2012 | Chan ................. H01L 33/62 257/89 |
| 2012/0032224 A1 | 2/2012 | Fang et al. |
| 2012/0051005 A1* | 3/2012 | Vanfleteren ......... H01L 23/3142 361/749 |
| 2014/0091337 A1 | 4/2014 | Ooyabu et al. |
| 2015/0041201 A1* | 2/2015 | Van Heck .............. H05K 1/181 174/260 |
| 2015/0263256 A1* | 9/2015 | Hsieh ................. H01L 25/0753 257/91 |
| 2016/0320037 A1 | 11/2016 | Wong et al. |
| 2016/0358849 A1 | 12/2016 | Jur et al. |

* cited by examiner

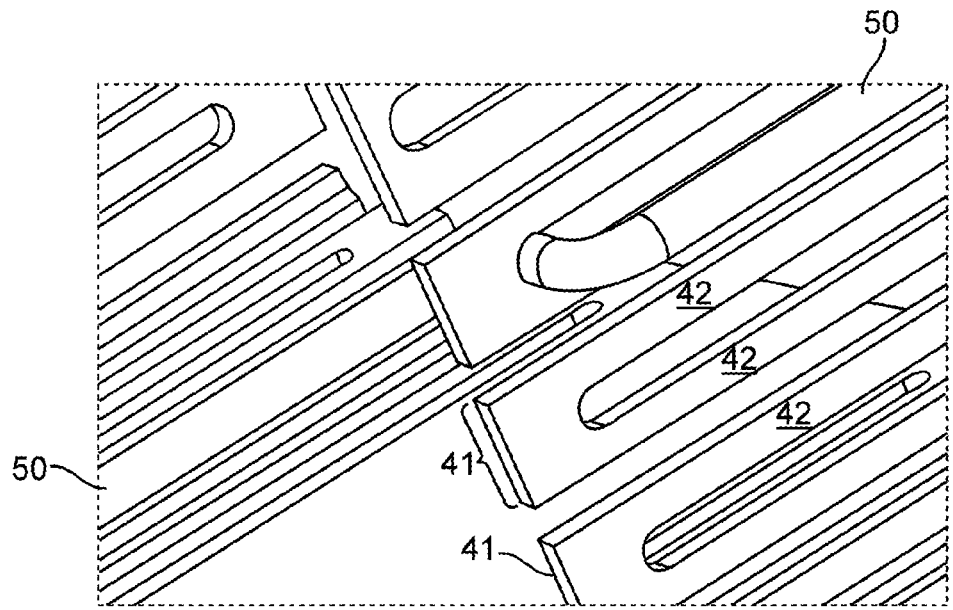
FIG. 4
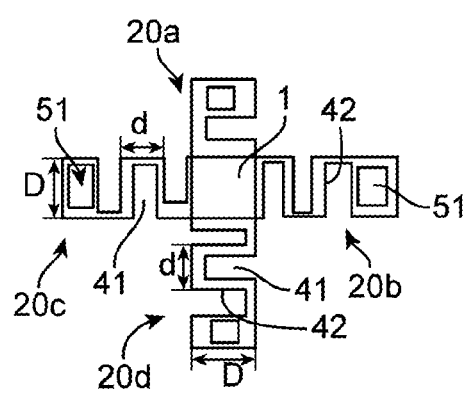 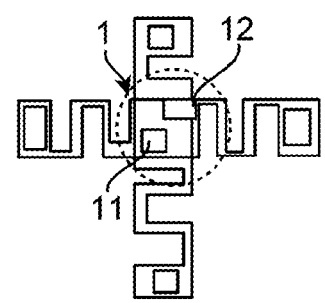
FIG. 5A       FIG. 5B

OPTOELECTRONIC ASSEMBLY, METHOD AND MOLDED PART

The present disclosure is a national stage application of International Patent Application No. PCT/EP2019/054448, which is filed on Feb. 22, 2019 and claims the priority of German Patent Application No. 102018104169.1, filed on Feb. 23, 2018 and entitled "Optoelectronic Assembly, Method and Shaped Part", and the disclosure content of which is hereby incorporated into the present application.

The invention relates to an optoelectronic assembly and to a method for the manufacture thereof. The invention further relates to a molded part with this assembly, and also to a carrier element.

The miniaturization of components, in particular electronic components or even assemblies, is progressing further. In this regard, the interconnection and also the contacting of the electronic assemblies to a current or voltage source is becoming increasingly complicated, in particular when a plurality of contact pads is provided. For example, this is the case with optoelectronic components when they are intended to mimic light of different colors. For controlling a so-called RGB element, four contacts are required, for example, which are controlled independently of each other. Due to the small dimensions of the electronic components, this is only possible with an ever-increasing effort.

At the same time, the miniaturization of the individual components opens up new applications. For example, electronic components can thus be woven into textiles, as a result of which not only are new design possibilities opened up, but applications are found for even further functionalities. For example, sensors of different types would be conceivable, but also LEDs or illuminants. The great flexibility of the textiles, which can be rotated, bent, pulled or compressed in any direction, precludes use of rigid optoelectronic components. While the components themselves can be made relatively small, the contacting of such components with supply lines or control lines which are provided for use in textiles can be difficult.

There is therefore an ongoing need to prepare electronic components, in particular optoelectronic components, for use in textiles.

These and other tasks are achieved with the subject-matter of the present independent claims. Designs and further aspects are the subject-matter of the subclaims.

In one aspect, an optoelectronic assembly comprises at least two electrical contacts on a surface of an optoelectronic component for supplying electrical energy. This is used for generating electromagnetic radiation. Furthermore, the optoelectronic assembly comprises at least two meander-shaped contacts, each of which comprises a first section and a second section. The first section in each case of the at least two meander-shaped contacts lugs is connected to one of the at least two electrical contacts. The second section in each case of the at least two meander-shaped contact lugs comprises a conductive fastening element. This is designed to effect a mechanical link with a fiber structure of a carrier, in particular a textile fiber structure. This creates an electrical connection to the first section as well as to the electrical component.

The two meander-shaped contact lugs make it possible, in a very flexible manner, to connect an electronic component to supply or control lines in a textile fiber structure. For example, a connection over different planes in a textile fiber structure is possible due to the meander-shaped contact lugs. The meander-shaped contact lugs additionally allow the optoelectronic assembly to be exposed to tensile or shearing forces without damaging the contact with further contact elements or supply or control lines in the textile fiber structure.

In one design, it is conceivable to provide a protective body, preferably made of a polymer. This can in particular be transparent. Another transparent material can also be used for this purpose, e.g. Plexiglas or glass. The protective body surrounds the optoelectronic component and the first sections in each case of the at least two meander-shaped contact lugs. The second sections in each case of the at least two meander-shaped contact lugs are arranged outside the protective body. In one aspect, the protective body may be injected so as to surround the device.

An optoelectronic assembly is thus realized which provides the optoelectronic component with sufficient protection against mechanical damage or chemical changes, but nevertheless at the same time offers sufficient flexibility for embedding and electrical contacting in a textile fiber structure due to the meander-shaped contact lugs.

In another design, it is provided that the first sections in each case of the at least two meander-shaped contact lugs lie essentially in a first plane. On the other hand, at least one of the second sections of the meander-shaped contact lugs is arranged in a second plane which comprises a different orientation with respect to the first plane. For example, the second plane may be at an angle within a range of 30° to 90° with respect to the first plane, for example within a range of 45°, 60° or 90°.

In another example, the meander-shaped contact numbers may be bent in the region of the intersections between the first and second sections. In this way, supply lines embedded in the different planes of a textile fiber structure can be achieved and contacted with the aid of the bent sections of the meander-shaped contact lugs. Alternatively or additionally, the at least second sections may comprise a meander-shaped structure which extends subsectionally in different directions. In particular, tensile or shearing forces which occur during processing or subsequent utilization of the textile fiber structure can thus be compensated without the optoelectronic assembly being damaged and contacting being impaired.

In a related design, the second sections comprise at least two, in particular 2-5, first sub-sections and two, in particular 2-5, second sub-sections intermittent with the first sub-sections. For example, a first sub-section of the respective second sections can be designed with a first length along a first direction, and a second sub-section with an initially shorter length in a second direction. An angle between the first and second directions may be within a range of 45° to 120°, in particular within a range of 90°. This serpentine structure considerably increases the probability of contacting and fastening the assembly as it is being pressed into the textile fiber structure. A significantly simpler fastening, which also acts mechanically, is thus possible.

In addition, the second sub-section can comprise a different width, in particular a smaller width, compared to the first sub-section. On the one hand, this saves material and on the other hand achieves a preferred direction in the case of rotational and shearing forces.

In one embodiment, it can be provided that the electrical fastening element is designed in such a way that it forms an electrical connection with a supply line embedded in or woven into the fiber structure of the carrier, in particular bringing about a mechanical coupling or connection. In this context, a supply line means any type of current-carrying line, that is to say in particular a power supply line, but also lines or wires for control or data signals. In addition to an electrical connection, a further mechanical connection or coupling can enhance the stability and the fastening in the textile fiber structure. For example, in order to fasten the optoelectronic assembly to one or more supply or control lines embedded in the textile fiber structure, the electrical fastening element may, in a further aspect, comprise an eyelet, a comb or a barb. In addition, a clip, a plurality of fingers or a serpentine wire mesh is also conceivable. With these elements, the electrical fastening element is mechanically hooked onto a supply or control line in the textile fiber structure. Textile fibers also interlock at the same time, as a result of which mechanical stability is increased.

Another aspect deals with the possibility of identifying contact lugs and contacts connected thereto, so that a short circuit or a malfunction during the production of a textile molded part is avoided. In order to prevent incorrect contacting and fastening to different lines, the optoelectronic assembly can comprise meander-shaped contacts of different lengths. For example, one of the at least two meander-shaped contact lugs may comprise a shorter length than the other of the at least two meander-shaped contact lugs. With such a design, for example, the contact for a common supply potential can be easily identified. By the orientation of the further contact lugs with respect to the lug of a different design, a precise identification of the lugs is thus possible. In this way, a short circuit or an incorrect contacting is prevented in an implementation or realization of the optoelectronic assembly in a textile fiber structure.

In another aspect of the invention, the optoelectronic assembly comprises at least four electrical contacts disposed on the surface of the optoelectronic component. One of these four electrical contacts can be, for example, a connection for a common supply potential. The optoelectronic assembly further comprises four meander-shaped contact lugs, each connected to one of the four electrical contacts. Two of the contact lugs in each case are arranged either antiparallel or at a predetermined angle, for example within a range of 90°. In this context, the optoelectronic component can be equipped, for example, as or with an RGB light-emitting diode for emitting red, green and blue light.

Moreover, in a further design of the optoelectronic assembly, the same can be designed with an electronic component, in particular an optoelectronic component, as a component for surface mounting.

Another aspect deals with the implementation and further processing as well as the use of such assemblies.

In one design, a textile assembly is proposed which comprises a textile and an optoelectronic assembly embedded therein. For improved protection against damage or detachment of the contacts, it can be provided that a portion of the textile, in which the assembly is attached, be encapsulated with a plastic and in particular overmolded.

In one design of the invention, a molded part is proposed which comprises a textile with an optoelectronic assembly embedded therein. The meander-shaped contact lugs of the optoelectronic assembly allow the assembly to be inserted into the textile and the textile to then be fixed in the desired shape. This permits a very flexible design and realization of textiles or molded parts in almost any design, which comprise various electronic assemblies, in particular optoelectronic assemblies. Such molded parts can be used, for example, in the automotive sector, in avionics and even in the consumer sector.

In one design, the molded part can comprise at least two supply lines embedded in the textile or woven into the textile, wherein one of the at least two meander-shaped contact lugs in each case contacts one of the supply lines.

Another aspect is concerned with the manufacture of such an optoelectronic assembly with optoelectronic components. In one design, it is proposed to provide a carrier element which comprises an stretchable carrier film, preferably made of a plastic. The optoelectronic assembly is applied to this carrier film in a detachable manner. To process for example the previously proposed molded part, the optoelectronic assembly can be detached from the carrier film in a simple manner. In addition, the meander-shaped contact lugs can be prepared in a suitable manner by stretching the separable carrier film before the optoelectronic assembly is detached. For example, the carrier film can be slightly stretched in one direction before the optoelectronic assembly is detached, so that the meander-shaped contact lugs arranged in this direction are also slightly pulled lengthwise. Paragraph In a method for producing an optoelectronic assembly, a stretchable carrier film is provided. At least two contact structures, each having a first and a second section, are applied to this carrier film. The second section in each case of the at least two contact structures comprises an electrically conductive fastening element. This is designed to form a mechanical and thus also an electrically conductive connection with a conducting wire embedded in a fiber structure of a carrier, in particular in a textile fiber structure. In addition, an optoelectronic component having at least two electrical contacts is provided on its surface. The optoelectronic component is oriented accordingly. Finally, first sections in each case of the at least two contact structures are each electrically connected in a conductive manner to one of the at least two electrical contacts of the optoelectronic component.

One aspect provides for the stretchable carrier film to be expanded or stretched in at least one spatial direction along one of the at least two contact structures for the detachment of the electronic assembly. The stretching causes the at least two meander-shaped contact lugs to be generated from the contact structure. The optoelectronic assembly is then detached from the expanded carrier film. In a further design, the carrier film can be stretched before detachment in all the directions in which the contact structures also run. As a result, the contact lugs are generated. Depending on the design, stretching can be effected differently, so that the resulting contact lugs also are of different lengths.

In another design, the step of applying at least two contact structures comprises a sectionwise partial cutting into opposite edges of each of the at least two contact structures. In one design, for example, the contact structure can be applied to the carrier as a flat metal surface. The metal surface is then cut partially to form the contact lugs.

In an additional step, it can be provided that the optoelectronic component of the assembly as well as the first sections (or at least parts thereof) be surrounded by a protective body. This can be formed from a polymer, in particular a transparent polymer.

In the preceding and in the following exemplary embodiments, reference is made above all to optoelectronic assemblies or optoelectronic components. This serves to simplify the explanation of the invention, but is not limited to such assemblies or components. Rather, the method according to the invention and the design make it possible to produce different electrical assemblies in which contact lugs contact a component on the one hand and on the other hand are provided in a textile fiber structure for attachment to the line. Examples of such assemblies may contain various types of sensors, logic circuits, amplifiers, transmitters and receivers, and the like.

The proposed principle will be explained below in detail with reference to several exemplary embodiments with the aid of drawings.

Figure 2:
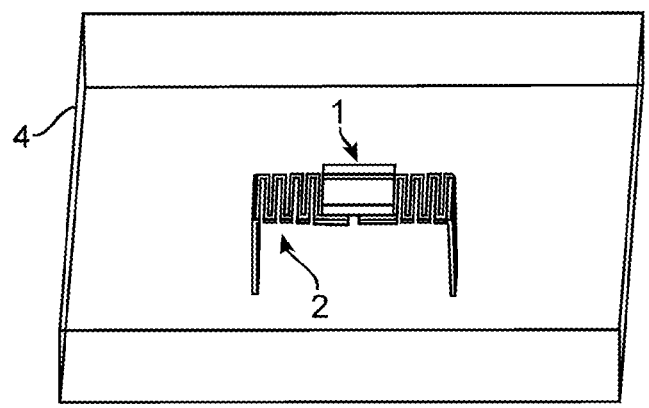
Figure 3:
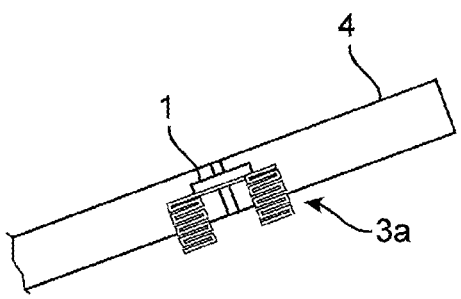
Figure 6:
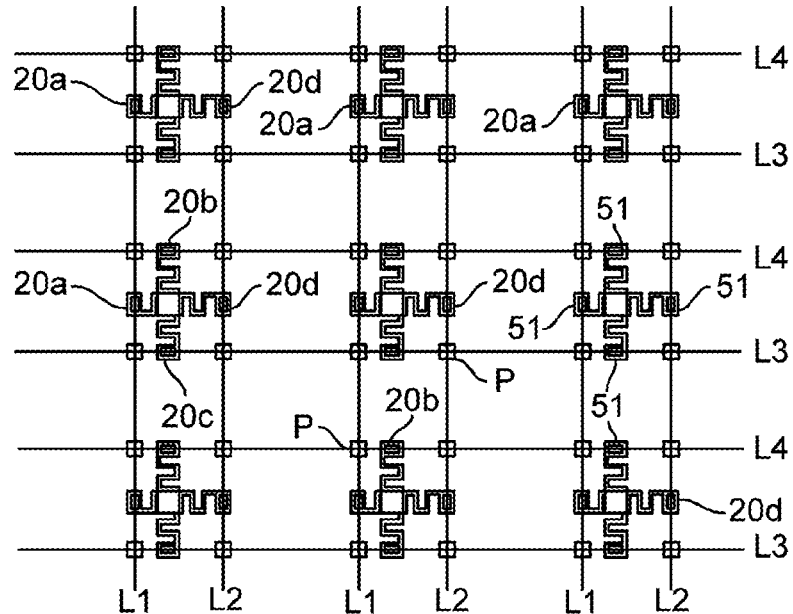
Figure 7:
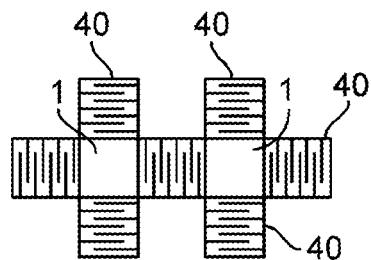
Figure 8:
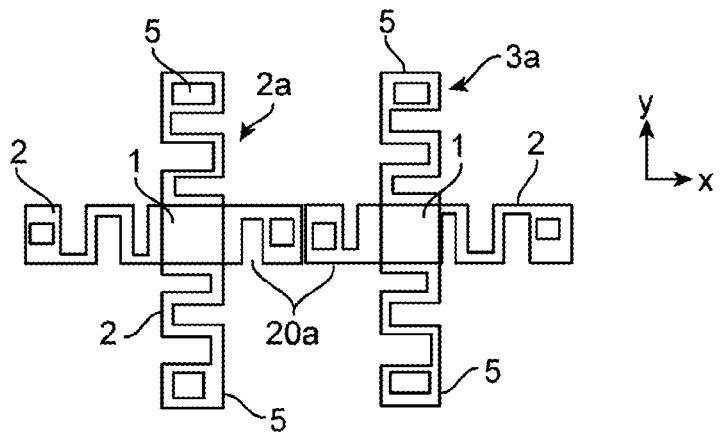
Figure 9:
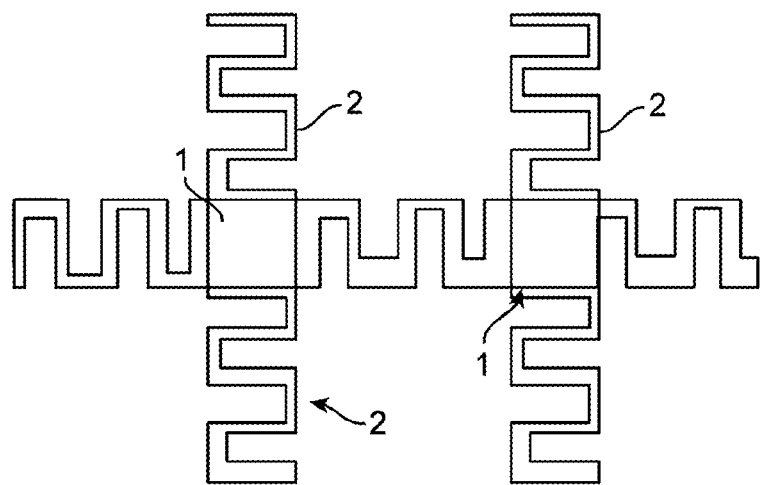
Figure 10:
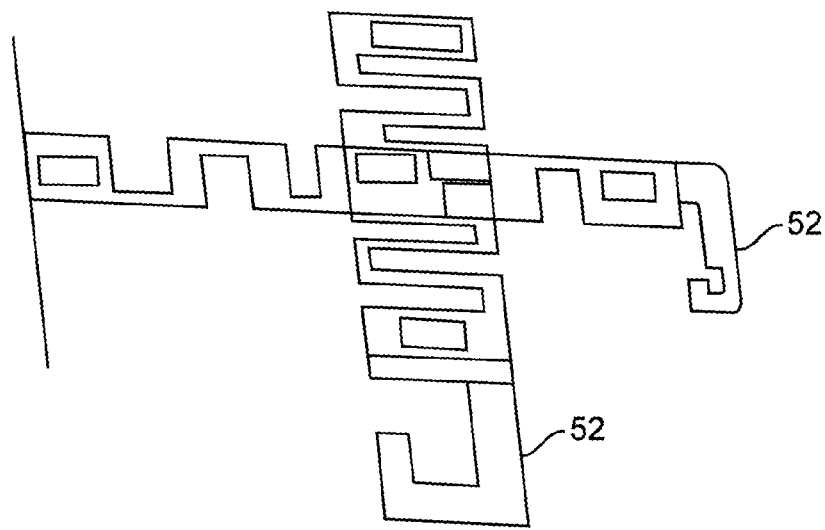
Figure 11:
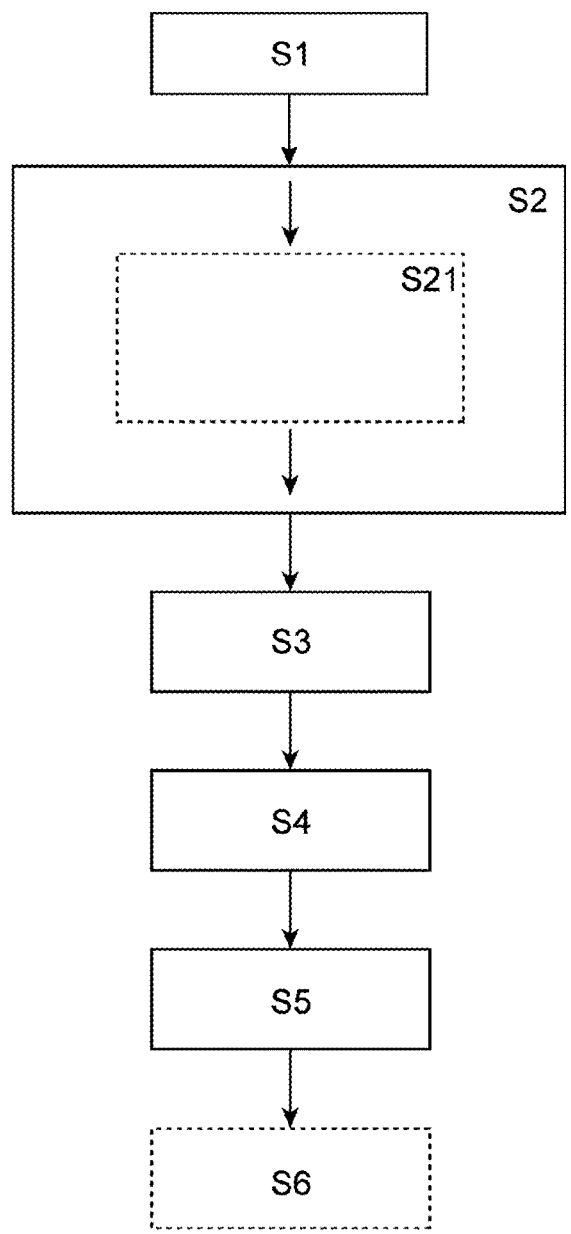
Figure 12:
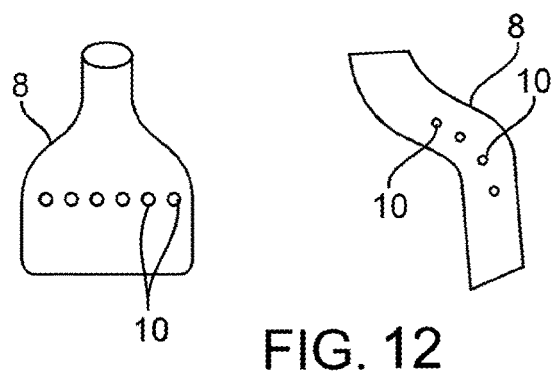

These show:

FIG. 1 a first design of an optoelectronic assembly according to the proposed principle;

FIG. 2 a design of the optoelectronic assembly with a protective body surrounding the assembly;

FIG. 3 a side view of the optoelectronic assembly according to FIG. 2;

FIG. 4 a detailed view of the second section of a meander-shaped contact lug with contacting of a conducting wire in a textile fiber structure;

FIGS. 5A and 5B a plan view of an electronic assembly according to a further design of the invention;

FIG. 6 a matrix view with a plurality of electronic assemblies embedded in a textile fiber structure;

FIG. 7 a plan view of two electronic assemblies formed on a carrier film;

FIG. 8 a view of two optoelectronic assemblies after expansion and detachment from the carrier substrate;

FIG. 9 an alternative view of two electronic assemblies after expansion and detachment from a carrier substrate;

FIG. 10 a perspective view of the electronic assembly according to FIG. 8;

FIG. 11 a design of a method for manufacturing an assembly according to the proposed principle;

FIG. 12 two examples of molded parts with textiles and assemblies attached therein.

Figure 13:
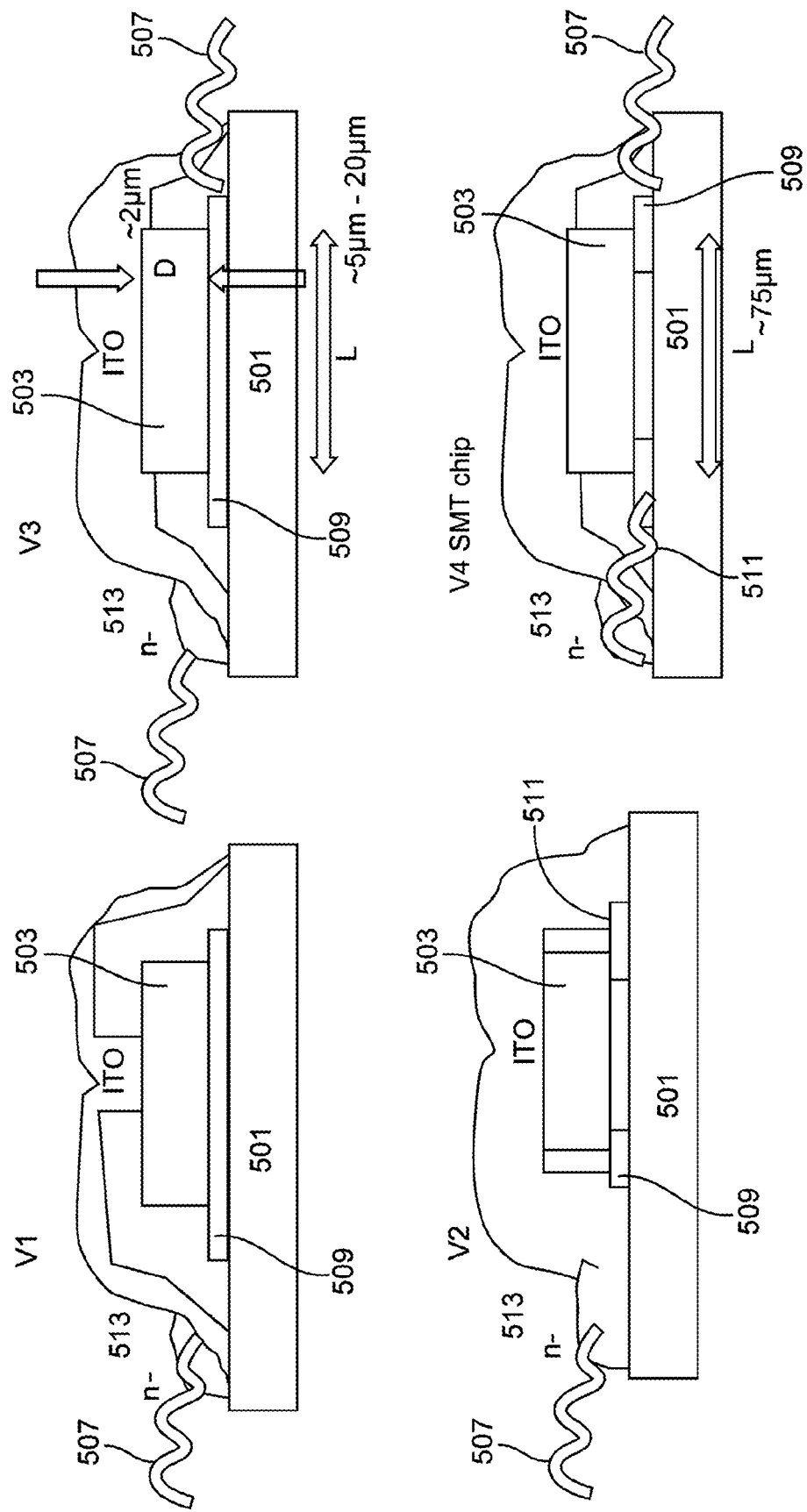

FIG. 13 shows a further embodiment using raw chips, in particular microLED raw chips, and four connection techniques V1 to V4.

Optoelectronic components, in particular components with emissions in different wavelength ranges, require a plurality of contacts which must be controlled independently of each other. In the case of an implementation of such components on printed circuit boards, such contacting is generally not a problem. However, circuit boards are rigid and inflexible so that they are not suitable for certain applications. Such applications are found, for example, in textiles in which electronic components are to be incorporated. The textiles are particularly flexible, can be compressed or stretched and bent in various directions. The same applies to fiber plastics in which fibers represent the carrier, and these are then embedded in a plastic or synthetic resin. An example of this would be a carbon fiber fabric. In the following, the term "textile" or "textile fiber structure" will generally be used for such fiber structures, including but not limited to fibers made of cotton and carbon, ceramic fibers and composites.

The components are relatively small so that they are normally not or hardly affected by stretching, compression or bending the textile. However, their contacting to electrical lines can be damaged by a tensile, a bending or a stretching load. This is also the case, in particular, when the electrical lines are located within the textile and are for example woven into the textile. The incorporation of electronic assemblies, for example optoelectronic assemblies, into the textile fiber structure during the production of a textile is relatively complex and prone to failure. It would therefore be desirable to connect components subsequently, i.e. after production of the actual textile, with interwoven electrical conductor tracks within the textile. In this case, the risk of a break in contact between the assembly and a conductor track of the textile due to a tensile, stretch or bending load should also be as low as possible.

For these reasons, an optoelectronic assembly is proposed which can be integrated into a textile or a textile fiber structure in a simple and straightforward manner by means of meander-shaped contact lugs. In this case, the meander-shaped contact lugs ensure an electrical contacting of conductor tracks within the textile fiber structure even in the event of a tensile, stretching or bending load. At the same time, a "hooking" with the textile fabric and the conductor tracks takes place due to the meander-shaped contact lugs, so that the assembly remains anchored in the textile. Mechanical stability is thus ensured.

FIG. 1 shows a perspective view of a design of an optoelectronic assembly according to the proposed principle. The optoelectronic assembly comprises an optoelectronic component 1 with an upper side for light emission and an underside with two contacts (not shown here) mounted thereon. The contacts are used for supplying power to the component. The two contacts are each connected in an electrically conductive manner to a meander-shaped contact lug 2. The two meander-shaped contact lugs comprise a first sub-section 2a which a second sub-section 3a seamlessly adjoins. The transition between the first and second sub-sections is indicated by the dashed line 21. In the present exemplary embodiment, this is located approximately in the middle of the region of the meander-shaped contact lugs 2 that is parallel to the component. However, it can also be located elsewhere depending on the application and implementation. The second sub-section 3a extends in part parallel to the component 1 and is then bent over at one point so that it runs essentially at 90° to the plane of the first sub-section 2a.

The meander-shaped contact lugs are basically constructed in a similar manner in their first and second sections. They possess sub-sections 42 which run along a first extension direction and are connected to each other via second, shorter sub-sections 41. The first sub-sections are selected to extend substantially parallel to the nearest side face of the component. In contrast, the shorter sub-sections 41 are arranged offset by 90°.

An S-shaped or serpentine structure is thus achieved, which allows the meander-shaped contact lugs to be moved in the different spatial directions. In other words, the meander-shaped contact lugs, and in particular the second sections 3a, can be lengthened, compressed or rotated in one of the spatial directions. Moreover, the S-shaped or serpentine structure of the contact lugs also hooks easily into different fibers of a textile. The assembly is thus held in place on the textile, and good mechanical fastening in a textile is made possible.

In the embodiment shown, the first sections 2a are designed for contacting the optoelectronic component; the sections 3a serve for contacting conductor tracks in the textile electrically, as shown below. An electrically conductive fastening element 5 in the form of an eyelet is located in the region of the sections 3a. This serves to create a contact with a conductor track within a textile fiber structure. Depending on the design, however, the further contact lug can also make an electrical contact, for example if said lug is manufactured from non-insulated metal. In addition, the fastening element 5 also serves to form a mechanical linkage to the textile fiber structure. The meander-shaped contact lugs allow the textile—not shown here—to stretch or bend without damaging the electrical contacting of the optoelectronic assembly or the contact points on the optoelectronic component and the contact lugs.

FIG. 2 shows an additional design of an optoelectronic assembly in which the first sections 2a and also the optoelectronic component 1 are embedded in a transparent protective body 4. In this design, the transition between the first sub-section 2a and the second sub-section 3a is placed at the boundary of the protective body, so that sub-section 2a is located within the protective body and sub-section 3 outside the protective body.

In the embodiment shown, the protective body has a larger lateral dimension than the optoelectronic component and the first sub-sections 2a. Its thickness is selected such that the first sub-sections and the electronic component are completely encased by the protective body. Only the second sub-sections 3a project from the protective body and thus allow electrical and mechanical contacting in the textile fiber structure via the fastening element 5. Further mechanical stability is achieved by the structure of the second sub-section, which in turn hooks into individual textile fibers. A side view of this design is shown in FIG. 3 in which the second sections 3a of the meander-shaped contact lugs are arranged outside the protective body. This also ensures a sufficient flexibility with regard to a tensile, stretching or bending load. The S-shaped or serpentine configuration of the meander-shaped contact lugs further ensures a mechanical fastening of the assembly also to the protective body 4 or in the textile fiber structure.

FIG. 4 shows a detailed design of a sub-section of the meander-shaped contact lug in which a sub-section engages mechanically in a conductor track 50 and thus also produces the electrical contact in addition to the mechanical fastening. The detailed view can be based on the preceding exemplary embodiments, for example. For reasons of clarity, individual textile fibers are not shown. The textile comprises woven-in conducting wires which are metallic and extend along predetermined spatial directions at different depths of the textile. The lines may be partially insulated to prevent short circuits and the like. In the area of the assemblies, however, they are however stripped so that an electrical contact can be established. The distances between such fibers 50 within the textile are selected such that they can easily be reached by the contact lugs of optoelectronic assemblies. In the embodiment, the optoelectronic assembly with the meander-shaped contact lugs is incorporated into the textile fiber.

The meander-shaped contact lug comprises a plurality of sub-sections 41 and sub-sections 42 adjoining thereto. The sub-sections 42 run in a first direction, in this example essentially parallel to the line 50. Two parallel sub-sections 42 are connected by the sub-section 41 as an intermediate piece. The thickness of the sub-section 41 is selected to be somewhat greater than the corresponding thickness of the sub-sections 42. Improved stability with regard to a rotational load on the meander-shaped contact lug is thereby achieved. The length of the sub-section 41 is in turn selected such that the distance between two adjacent sub-sections 42 corresponds approximately to the thickness of the conductor track 50. Good electrical contacting and mechanical fastening are thus achieved.

The meander-shaped contact lug also hooks in a suitable manner several times in the line 50 so that electrical contacting is ensured even in the event of tension in different directions.

FIGS. 5A and 5B show a schematic plan view of another design of an optoelectronic assembly according to the proposed principle. In the embodiment shown, the optoelectronic assembly comprises an electronic component 1 which is designed as an RGB component for emitting light of different wavelengths. For this purpose, different contacts, which are located on an underside of the component as shown in FIG. 5B, are necessary for controlling the individual light components. The individual contacts, of which two 11 and 12 are shown in particular, are each connected to one of the meander-shaped contact lugs (not shown). In the design with an RGB component, there are thus three contacts for the respective light colors R, G and B as well as an electrical contact for the common supply or ground potential. This too is linked to a contact lug, in the example shown to the contact lug 20a. In order to identify this common electrical contact, the contact lug 20a is designed to be significantly shorter than the contact lugs 20b to 20d. This orientation enables the respective contacts to be identified later in a simple manner prior to fastening in a textile fiber structure.

The four meander-shaped contact lugs 20a to 20d each have a contact eyelet at their respective ends for mechanical and electrical contacting with conductor tracks of the textile fiber structure.

The contact lugs 20a to 20d are each designed with a plurality of alternating sub-sections. The length "d" of the sub-sections 41 is approximately equal to the length "D" of the sub-sections 42. In the illustrated exemplary embodiment, the angle between the sub-sections 41 and we two in about 90°. Depending on the manufacture, however, other angles between the sub-sections are also possible. However, this angle should not be selected too large, in order also to enable mechanical fastening by a concatenation of the serpentine meandering structure with individual textile fibers. The thickness of the individual sub-section is different, but can be adjusted depending on requirements and rigidity and flexibility.

FIG. 6 shows a design of a matrix structure with a plurality of optoelectronic assemblies which are mechanically and electrically connected to respective conductor tracks of a textile fiber structure. The conductor tracks are woven into the textile and in this embodiment run on two planes which are slightly offset relative to each other. Alternatively, the conductor tracks can also run in the same plane, provided short circuits are prevented by corresponding insulation of the conductor tracks. In the example, two conductor tracks L1 and L2 in each case are arranged alternately in a first direction (here perpendicular) in a first plane. Two further conductor tracks L3 and L4 run from right to left and, in the plan view, intersect the pair of first conductor tracks at the intersection points P. Since the conductor tracks run on different planes, the risk of a short circuit is reduced. In addition, the conductor tracks in the region of the intersection points P are still insulated from one another in order to prevent a short circuit between the respective conductor tracks. The insulation can be effected for example with enameled wire or the like. The intersection points can also comprise a mechanical fastening in order to better anchor the matrix in the textile. The optoelectronic assemblies are arranged with their fastening elements between two intersection points P in each case such that each fastening element is connected to one of the conductor tracks. Care is taken here to ensure that the same fastening element in each case forms an electrical connection with the same conductor tracks. For example, the meander-shaped contact lug 20a of each assembly is mechanically and electrically connected to the conductor tracks L1. The contact lug 20d contacts the electrical conductor tracks L2. In a similar manner, the contact lugs 20b contact the conductor tracks L4 and the contact lugs 20c contact the conductor tracks L3. The colors of the individual RGB components can thus be controlled. Different light patterns can thus be realized in the textile by suitable control circuitry and contacting the conductor tracks L1 to L4.

The contacting is effected by the eyelet 51 through which the respective conductor track runs. This eyelet can be cut open at one side, so that contacting is also possible when the conductor track has been woven into the textile. Alternatively, the conductor track can be passed through the eyelet and woven into the textile. The eyelet establishes an electrical connection, but at the same time allows a certain flexibility, so that the eyelet can easily be moved along the conductor path between two intersection points P without the electrical connection being impaired. A mesh of conductor tracks and assemblies is formed which, in combination with the textile, has a high mechanical stability.

FIG. 7 shows a design of two optoelectronic assemblies on a carrier substrate during production. The subsequent meander-shaped contact lugs in this case are designed as slotted structures. These are produced by applying metal surfaces as contact structures 40 to a carrier substrate, for example a stretchable polymer. The optoelectronic components are placed and contacted in the first section in each case of these contact structures. Subsequently or already in a preceding step, the contact structures are cut in in an alternating manner so that the metallic surface is alternately interrupted in sections as indicated in FIG. 7. This results in an S-shaped or serpentine contact structure consisting of first and second sub-sections. If the stretchable carrier film is now pulled apart or expanded, the individual branches of the contact structures will also spread out, and the meander-shaped contact lugs form.

FIG. 8 shows a corresponding design in a schematic view in which the two electrical assemblies are detached from the carrier substrate after expansion. In this case, the carrier substrate was stretched in the x- and y-directions. Contact lug 2a is produced by separating the contact structure before or after the carrier substrate is expanded.

The fastening elements 5 of each individual contact lug can be realized in a similar manner by cutting or etching a small inner metal region. Whereas in FIG. 8 the two electrical assemblies have already been singulated by severing the contact lug 2a in the middle, FIG. 9 shows a preceding manufacturing step with a slightly modified design in the end region of the contact lugs. The contact structure was realized with partially cut metal surfaces so that an S-shaped or serpentine meander structure results. Special fastening elements for contacting conductor tracks have not been provided here. Rather, the meander structure of each contact lug also serves over its entire length as a fastening element for a conductor track. This may be easier to manufacture since a further production step is eliminated. The central contact structure still has to be singulated in order to detach the assembly. However, this can also be left like this as long as a complete singulation of all assemblies for the corresponding application is not to take place.

FIG. 10 shows a perspective view of another design on the underside. Here, each individual contact lug is again connected to one of the contacts of the optoelectronic component. In addition, barbs 52 are also provided as well as the eyelet. These serve both as a possible electrically conductive connection, but also hook into the textile fabric.

The embodiments shown here can be implemented in various ways. In addition to the fastening eyelets, barbs, such as in FIG. 9, a comb, clips, finger-shaped or serpentine further wire mesh are conceivable. Essentially, the meander-shaped contact lug increases the surface area so that a simple mechanical fastening is achieved by hooking into the textile fibers with the meander-shaped contact lug.

FIG. 11 shows an embodiment of a method for the manufacture of an assembly, in particular an electronic assembly according to the proposed principle. In a first step S1, a stretchable carrier film is provided. This can consist, for example, of a stretchable polymer or comprise such a polymer. In a second step S2, at least two contact structures are applied to the carrier film, each of which comprise a first and a second section. The second section in each case of the at least two contact structures comprises an electrical fastening element which is designed to effect a mechanical linkage with a fiber structure of a carrier, in particular a textile fiber structure. In a further optional step S21, the at least two contact structures are cut in sections. This takes place alternately offset on the two longitudinal edges of the contact structures. This step can also take place at a later point in time, for example after step S3. In this step S3, the optoelectronic component is provided that comprises a plurality of contacts on one side. The contacts are electrically connected conductively in a known manner to a first section in each case of the at least two contact structures.

After such a connection, in a further step S4, the stretchable carrier film is expanded in at least one spatial direction along one of the contact structures in order to create the at least two meander-shaped contact lugs. The optoelectronic assembly thus produced is then detached in step S5 from the expanded carrier film, for example pulled off or chemically separated.

A step S6 may optionally be provided next or even before detachment. Here, the optoelectronic component and the first sections are surrounded by a protective body, preferably a polymer, in particular a transparent polymer. The second sections remain free for contacting. Depending on the design, the carrier film can thus also be enclosed in the protective body.

Finally, FIG. 12 shows two examples of textile assemblies and molded parts as manufactured with a textile fiber structure. In this case, a textile assembly is provided comprising a textile as well as one or more optoelectronic components which are introduced into the textile, for example woven in, and contacted with conductor tracks. The latter likewise run within the textile. For better protection and localization of the components, these, as well as a small subregion of the textile in which the components are arranged, are enclosed and sealed with a plastic by injection molding. The flexibility of the textile assembly is still retained, and the assembly can be further processed.

Each molded part 8 has a plurality of optoelectronic components 10 woven and embedded with the molded part. The molded parts have a funnel-shaped design, for example. Another molded part is a curved surface and can be used in the automotive sector, among other things as indicator or light source. The molded parts are produced by bringing a textile with the assemblies woven therein into the desired shape. The shaping is flexible and can also be adjusted at a later stage without jeopardizing the contacting of the molded parts with the conductor tracks. When the desired shape is achieved, the textile assembly or textile textile is provided with synthetic resin or a plastic and fixed.

Although the embodiments show optoelectrical assemblies, the invention is not limited to such assemblies. Rather, each semiconductor body or an electrical component in this design can be contacted with meander-shaped contact lugs, so that this assembly can be used mechanically and electrically with a textile fiber structure. The various fastening forms can also be combined with each other. Contacting in conductor tracks can take place in one plane but also in different planes and is not limited to one or two planes.

FIG. 13 shows a further embodiment using the raw chips 503, in particular microLED raw chips, four connection techniques V1 to V4 being illustrated in FIG. 13.

The raw chips 503 and/or conductor tracks 505 or wiring 507 used may be provided in a flexible manner. In all four connection techniques V1-V4, raw chips 503 are affixed on contact surfaces 509 attached to a substrate 501 and in particular contacted via intervia 511. Substrates 501 may comprise intervias 511.

The affixed raw chips 503 may be coated, in particular by means of reflector layers or reflector surfaces, and/or final ITO layers (indium tin oxide). Further electrical contacting may be created by means of, for example, small n-doped contact regions 513 and flexible wiring 507. The n-contact regions 513 may contact the substrate 501 and a corresponding ITO layer.

Thicknesses D of raw chips 503 may be selected within a range of approximately 2 microns, as shown for example in V3. In V3, it is also shown that lengths L of raw chips 503 may be created within a range of approximately 5 microns to about 20 microns.

V4 represents a surface-mounted (SMT) raw chip 503 created by surface mount technology. According to V4, the length L of a raw chip 503 may be created within a range of approximately 75 microns.

LIST OF REFERENCE SIGNS

1 Component
2 Contact lug
2a First section
3a Second section
4 Protective body
5 Fastening element
8 Molded part
10 Optoelectronic assembly
11, 12 Electrical contacts
20a-20d Contact lugs
21 Interface, transition region
41 Sub-section
42 Sub-section
50 Supply line
51 Eyelet
52 Barb
D, d Thickness
L1, L2 Supply line
L3, L4 Supply line
P Intersection point
501 Substrate
503 Raw chip
505 Conductor tracks
507 Wiring
509 Contact surfaces
511 Intervia
513 Contact region
D Thickness
L Length

The invention claimed is:

1. Optoelectronic assembly, comprising:
at least two electrical contacts on a surface of an optoelectronic component for supplying electrical energy for generating electromagnetic radiation;
at least two meander-shaped contact lugs, each comprising a first section and a second section;
wherein each first section of the at least two meander-shaped contact lugs is coupled to one of the at least two electrical contacts and comprises a meander shaped structure that extends within a plane substantially parallel to the surface of the optoelectronic component,
wherein the second section in each case of the at least two meander-shaped contact lugs comprises an electrically conductive fastening element and is designed to go into a mechanical linkage with a fiber structure of a carrier, in particular a textile fiber structure, and to create an electrical connection to the first section.

2. Optoelectronic assembly according to claim 1,
further comprising:
a protective body, which surrounds the optoelectronic component and the first sections of each of the at least two meander-shaped contact lugs, and the second sections in each case of the at least two meander-shaped contact lugs are arranged outside the protective body.

3. Optoelectronic assembly according to claim 1
in which the electrical fastening element is designed to form an electrical connection with a supply line embedded in or woven into the fiber structure of the carrier, in particular to mechanically couple the supply line.

4. Optoelectronic assembly according to claim 1,
wherein the first sections in each case of the at least two meander-shaped contact lugs lie essentially in a first plane, and at least one of the second sections lies in a second plane with a different orientation to the first plane.

5. Optoelectronic assembly according to claim 1,
wherein at least the second sections comprise a meander-shaped sub-structure extending subsectionally in different directions.

6. Optoelectronic assembly according to claim 5,
in which the second sections comprise at least two, first sub-sections and two, in particular two to five, intermittent second sub-sections.

7. Optoelectronic assembly according to claim 5,
wherein a first sub-section of the second sections extends with a first length along a first direction, and a second sub-section with a shorter length than the first length extends in a second direction which is rotated relative to the first length within a range of 45° to 120°, in particular 90°.

8. Optoelectronic assembly according to claim 5,
wherein the second sub-section has a width different from the first sub-section, in particular is wider than the first sub-section.

9. Optoelectronic assembly according to claim 4,
wherein the first sections of the at least two meander-shaped contact lugs comprise substantially the same meander-shaped structure as the at least second sections.

10. Optoelectronic assembly according to claim 1,
wherein the electrical fastening element includes at least one of:
an eyelet;
a barb;
a comb;
a clip;
a plurality of fingers; or
a serpentine wire mesh.

11. Optoelectronic assembly according to claim 1,
wherein at least one of the at least two meander-shaped contact lugs has a length different from the other of the at least two meander-shaped contact lugs.

12. Optoelectronic assembly according to claim 1,
wherein the at least two meander-shaped contact lugs are flexibly deformable.

13. Optoelectronic assembly according to claim 1,
in which four electrical contacts are arranged on the surface of the optoelectronic component; and
with four meander-shaped contact lugs, each of which contacts one of the four electrical contacts in such a way that two adjacent contact lugs are arranged at an angle, in particular within a range of 90°.

14. Textile assembly, having:
a textile;
an optoelectronic assembly according to claim 1.

15. Textile assembly according to claim 14,
in which a portion of the textile in which the assembly is attached is encased with a plastic, in particular encapsulated.

16. Method for manufacturing an optoelectronic assembly, comprising:
providing a stretchable carrier film;
applying at least two contact structures to the carrier film, each of which comprises a first and a second section, the second section in each case of the at least two contact structures comprising an electrically conductive fastening element which is designed to effect a mechanical linkage to a fiber structure of a carrier, in particular a textile fiber structure;
providing an optoelectronic component having at least two electrical contacts on its surface;
electrically connecting a first section in each case of the at least two contact structures to one of the at least two electrical contacts.

17. Method according to claim 16,
further comprising:
expanding the stretchable carrier film in at least one spatial direction along the contact structure in order to create the at least two meander-shaped contact lugs;
complete detachment of the optoelectronic assembly from the expanded carrier film.

18. Method according to claim 16,
wherein the step of applying at least two contact structures comprises:
section-wise offset cutting of opposite edges of each of the at least two contact structures.

19. Method according to claim 16,
wherein the step of applying at least two contact structures comprises:
forming the electrical fastening element including at least one of the following elements:
an eye;
a barb;
a comb;
a clip;
a plurality of fingers; or
a serpentine wire mesh.

20. Method according to claim 16, further comprising:
surrounding the optoelectronic component and the first sections with a protective body.

\* \* \* \* \*